(12) United States Patent
Tanaka

(10) Patent No.: US 8,193,074 B2
(45) Date of Patent: Jun. 5, 2012

(54) INTEGRATION OF DAMASCENE TYPE DIODES AND CONDUCTIVE WIRES FOR MEMORY DEVICE

(75) Inventor: Yoichiro Tanaka, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 803 days.

(21) Appl. No.: 12/292,620

(22) Filed: Nov. 21, 2008

(65) Prior Publication Data

US 2010/0127358 A1      May 27, 2010

(51) Int. Cl.
H01L 21/326 (2006.01)
(52) U.S. Cl. .. 438/467; 438/600; 438/131; 257/E23.147
(58) Field of Classification Search ............... 438/467, 438/600, 131; 257/E23.147
See application file for complete search history.

(56) References Cited

U.S. PATENT DOCUMENTS

| | | | |
|---|---|---|---|
| 5,780,908 A | 7/1998 | Sekiguchi et al. | |
| 5,886,392 A * | 3/1999 | Schuegraf | 257/530 |
| 5,915,167 A | 6/1999 | Leedy | |
| 6,034,882 A | 3/2000 | Johnson et al. | |
| 6,083,787 A | 7/2000 | Lee | |
| 6,133,149 A | 10/2000 | Yeh | |
| 6,153,537 A | 11/2000 | Bacchetta et al. | |
| 6,420,215 B1 | 7/2002 | Knall et al. | |
| 6,525,953 B1 | 2/2003 | Johnson | |
| 6,952,030 B2 | 10/2005 | Herner et al. | |
| 6,952,043 B2 | 10/2005 | Vyvoda et al. | |
| 6,972,252 B1 | 12/2005 | Sanganeria et al. | |
| 7,238,607 B2 | 7/2007 | Dunton | |
| 7,244,979 B2 | 7/2007 | Iwasaki et al. | |
| 7,285,464 B2 | 10/2007 | Herner et al. | |
| 7,442,648 B2 | 10/2008 | Kim et al. | |
| 2002/0196654 A1 | 12/2002 | Mitarai et al. | |
| 2004/0137721 A1 | 7/2004 | Lim et al. | |
| 2005/0052915 A1 | 3/2005 | Herner et al. | |
| 2005/0226067 A1 | 10/2005 | Herner et al. | |
| 2006/0189077 A1 | 8/2006 | Herner et al. | |
| 2006/0249753 A1 | 11/2006 | Herner et al. | |

(Continued)

FOREIGN PATENT DOCUMENTS

JP          2009218259 A     9/2009

(Continued)

OTHER PUBLICATIONS

International Preliminary Report on Patentability issued in PCT Application PCT/US2009/064915, mailed on Jun. 3, 2011.

(Continued)

*Primary Examiner* — Bradley K Smith
*Assistant Examiner* — Amar Movva
(74) *Attorney, Agent, or Firm* — The Marbury Law Group, PLLC

(57) ABSTRACT

A method of making a semiconductor device includes forming a first conductivity type polysilicon layer over a substrate, forming an insulating layer over the first conductivity type polysilicon layer, where the insulating layer comprises an opening exposing the first conductivity type polysilicon layer, and forming an intrinsic polysilicon layer in the opening over the first conductivity type polysilicon layer. A nonvolatile memory device contains a first electrode, a steering element located in electrical contact with the first electrode, a storage element having a U-shape cross sectional shape located over the steering element, and a second electrode located in electrical contact with the storage element.

21 Claims, 5 Drawing Sheets

U.S. PATENT DOCUMENTS

| | | |
|---|---|---|
| 2006/0292301 A1 | 12/2006 | Herner |
| 2007/0164309 A1 | 7/2007 | Kumar et al. |
| 2007/0284656 A1 | 12/2007 | Radigan et al. |
| 2008/0026510 A1 | 1/2008 | Herner et al. |
| 2008/0073755 A1 | 3/2008 | Ang et al. |
| 2008/0119027 A1 | 5/2008 | Subramanian et al. |
| 2008/0254576 A1 | 10/2008 | Hsia et al. |

FOREIGN PATENT DOCUMENTS

| | | |
|---|---|---|
| WO | 2007143387 A2 | 12/2007 |
| WO | 2008061194 A1 | 5/2008 |

OTHER PUBLICATIONS

U.S. Appl. No. 11/819,078, filed Jun. 25, 2007, Herner.
U.S. Appl. No. 11/863,734, filed Sep. 28, 2007, Tanaka.
U.S. Appl. No. 11/864,205, filed Sep. 28, 2007, Chen et al.
U.S. Appl. No. 12/000,758, filed Dec. 17, 2007, Petti.
U.S. Appl. No. 12/007,780, filed Jan. 15, 2008, Herner.
U.S. Appl. No. 12/007,781, filed Jan. 15, 2008, Dunton.
U.S. Appl. No. 12/149,151, filed Apr. 28, 2008, Chen.
U.S. Appl. No. 12/216,924, filed Jul. 11, 2008, Ping.

* cited by examiner

Silicon seed region

Bare SiO$_2$ region

US 8,193,074 B2

INTEGRATION OF DAMASCENE TYPE DIODES AND CONDUCTIVE WIRES FOR MEMORY DEVICE

FIELD OF THE INVENTION

The present invention relates generally to the field of semiconductor device processing, and specifically to non-volatile memory devices and methods of making same.

BACKGROUND

Hemer et al., U.S. patent application Ser. No. 10/955,549 filed Sep. 29, 2004 (which corresponds to US Published Application 2005/0052915 A1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Nonvolatile Memory Cell Comprising a Reduced Height Vertical Diode," filed Dec. 17, 2004 and U.S. patent application Ser. No. 11/819,078 filed Jul. 25, 2007. However, in the subtractive method, the height of the semiconductor pillar may be limited by thin and soft photoresist used as the etching mask. The photoresist mask material etches at a slower rate than the semiconductor material, but etches nonetheless, and some mask material must remain when the semiconductor etch is completed. The oxide gap filling step after pillar etch presents a processing challenge when the aspect ratios of the openings between the pillars increases and/or the CMP process or etchback of the gap fill layer removes a significant thickness of the deposited semiconductor material.

SUMMARY

One embodiment of the invention provides a method of making a semiconductor device, including forming a first conductivity type polysilicon layer over a substrate, forming an insulating layer over the first conductivity type polysilicon layer, and forming an intrinsic polysilicon layer in the opening that is in the insulating layer exposing the first conductivity type polysilicon layer.

Another embodiment of the invention provides a nonvolatile memory device, containing a first electrode, a steering element located in electrical contact with the first electrode, a storage element having a U-shape cross sectional shape located over the steering element, and a second electrode located in electrical contact with the storage element.

Another embodiment of the invention provides a method of making a semiconductor device, including providing conductive rails and an insulating gap-filling material located between the rails, etching an upper portion of the conductive rails to recess the conductive rails below an upper surface of the insulating gap-filling material, forming a first conductivity type semiconductor material layer over the conductive rails and over the insulating gap-filling material, planarizing the first conductivity type semiconductor material layer to expose the insulating gap-filling material such that the first conductivity type semiconductor material remains in recesses above the conductive rails, forming an insulating layer over the first conductivity type semiconductor material, forming openings in the insulating layer exposing the first conductivity type semiconductor material, forming an intrinsic semiconductor material in the openings, and forming a second conductivity type semiconductor material in the openings to form a p-i-n diode.

DETAILED DESCRIPTION OF THE PREFERRED EMBODIMENTS

Figure 1A:
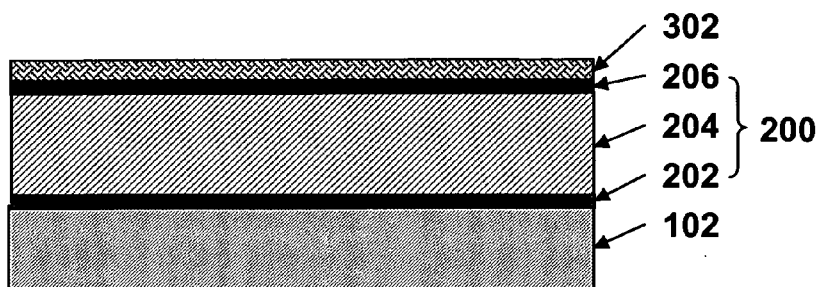
FIGS. 1a to 1f are side cross-sectional views illustrating stages in formation of a device according to an embodiment of the present invention.

One embodiment of the invention provides a method of making a semiconductor device, comprising forming a first conductivity type polysilicon layer over a substrate, forming an insulating layer over the first conductivity type polysilicon layer, where the insulating layer comprises an opening exposing the first conductivity type polysilicon layer, and forming an intrinsic polysilicon layer in the opening over the first conductivity type polysilicon layer.

In some embodiments, the method further includes forming a conductive film over the substrate prior to the step of forming the first conductivity type polysilicon layer, patterning the conductive film and the first conductivity type polysilicon layer to form rails that comprise lower electrodes covered by the first conductivity type polysilicon layer, and filling gaps between the rails with an insulating gap-filling material prior to the step of forming the insulating layer. The conductive film may contain a first barrier layer, a conductive wiring material located over the first barrier layer, and a second barrier layer located over the conductive wiring material. The conductive wiring material can be any suitable conductive material, such as tungsten, aluminum, copper, or alloys thereof. The first and second barrier layers can be independently selected from titanium nitride, tantalum, tantalum nitride, ruthenium, titanium tungsten, tungsten nitride, or a combination thereof.

The device may comprise a portion of any suitable semiconductor device having a pillar shape, such as a diode, transistor, etc. Preferably, the device comprises a diode, such as a p-i-n diode having a pillar shape.

The step of forming the intrinsic polysilicon layer in the opening preferably includes selectively growing intrinsic polysilicon in the opening on an exposed polysilicon material of the first conductivity type (such as n-type) polysilicon layer such that the intrinsic polysilicon layer partially fills the opening. Alternatively, the step of forming the intrinsic polysilicon layer in the opening includes depositing intrinsic polysilicon into the opening and over the upper surface of the insulating layer, planarizing the deposited intrinsic polysilicon, and etching an upper portion of the intrinsic polysilicon deposited in the opening to recess the intrinsic polysilicon layer below the surface of the insulating layer.

The second conductivity type dopants, such as p-type dopants, can be implanted into the upper portion of the intrinsic polysilicon layer to form a second conductivity type (such as p-type) region of the p-i-n diode. Alternatively, the second conductivity type region of the p-i-n diode can be formed by selectively depositing a layer of second conductivity type polysilicon in the opening on the intrinsic polysilicon layer. Of course, the position of the p-type and n-type regions can be reversed if desired. To form a p-n type diode, the second conductivity type (such as p-type) polysilicon can be formed directly over the first conductivity type semiconductor material to form the diode.

A storage element of a nonvolatile memory cell can be formed over the p-i-n diode. The storage element can be an antifuse dielectric layer, and the step of forming the storage element can be a step of plasma oxidation of an upper portion of a second conductivity type polysilicon material of the diode. Alternatively, the step of forming the storage element can comprise depositing an antifuse dielectric layer using a method, such as high-pressure ionized chemical vapor deposition, or any other method suitable for depositing dielectric materials. In some embodiments, the storage element formed can have a U-shape cross sectional shape. More specifically, the storage element comprises an antifuse dielectric layer having an open cylinder shape comprising a planar bottom portion located over the steering element and a collar shaped upper portion located over and in contact with the bottom portion. In some embodiments, prior to forming the antifuse dielectric layer, a third barrier layer can be formed by high-pressure ionized physical vapor deposition in the opening and etching an upper portion of the third barrier layer to remove the barrier layer from a side wall of the opening. An upper electrode can then be formed over the storage element.

FIGS. 1a through 1f show a preferred method of forming the device using selective deposition.

Referring to FIG. 1a, the device is formed over a substrate 100 (not shown). The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device. An insulating layer 102 is preferably formed over substrate 100. The insulating layer 102 can be silicon oxide, silicon nitride, high-dielectric constant film, Si—C—O—H film, or any other suitable insulating material.

A conductive film 200, containing a conductive wiring material 204, and optionally containing a first barrier layer 202 located underneath the conductive wiring material and a second barrier layer 206 located over the conductive wiring material, may be formed over the insulating layer 102.

The conductive wiring material 204 can comprise any suitable conducting material known in the art, such as tungsten, copper, aluminum, tantalum, titanium, cobalt, or alloys thereof. For example, in some embodiments, tungsten is preferred to allow processing under a relatively high temperature. In some other embodiments, copper or aluminum is a preferred material.

The first barrier layer 202 and the second barrier layer 206 can be independently selected from titanium nitride, tantalum, tantalum nitride, ruthenium, titanium tungsten, tungsten nitride, or a combination thereof. If upper surface of the conductive wiring material 204 is tungsten, tungsten nitride can be formed on top of the conductive wiring material 204 instead of TiN by nitriding the upper surface of the tungsten. For example, the following conductive layer combinations may be used: Ti(202)/W(204)/WN(206), Ti/W/TiN, Ti/Al/TiN, (Ti/TiN)/Al/TiN, Ti/Al/TiW, or any combination of these layers.

A first conductivity type polysilicon layer 302 can be formed over the conductive film 200. The conductivity type of the semiconductor material can be n-type or p-type. Alternatively, other suitable semiconductor materials can also be used, such as germanium, silicon germanium, or other compound semiconductor materials. For simplicity, this description here and below refers to the semiconductor material as polysilicon, but it will be understood that the skilled practitioner may select other suitable materials instead. Furthermore, the semiconductor layer 302 may be amorphous or single crystalline instead of polycrystalline.

Figure 1B:
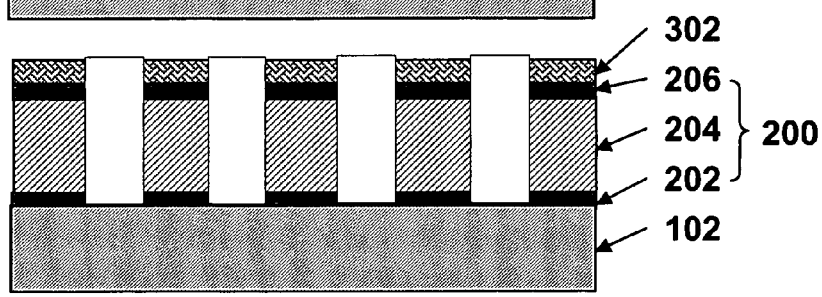

Turning to FIG. 1b, the conductive film 200 and the first conductivity type polysilicon layer 302 are patterned using any suitable masking and etching process, to form rails that comprise lower electrodes 200 covered by the first conductivity type polysilicon layer 302. In one embodiment, a photoresist layer is deposited over the first conductivity type polysilicon layer 302, patterned by photolithography, and the layers 200 and 302 are etched using the photoresist layer as a mask. The photoresist layer is then removed using standard process techniques. Alternatively, the resulting structure shown in FIG. 1b may instead be formed by a Damascene method, in which at least the conductive film 200 and the first conductivity type polysilicon layer 302 are formed in grooves in an insulating layer by deposition and subsequent planarization.

Figure 1C:
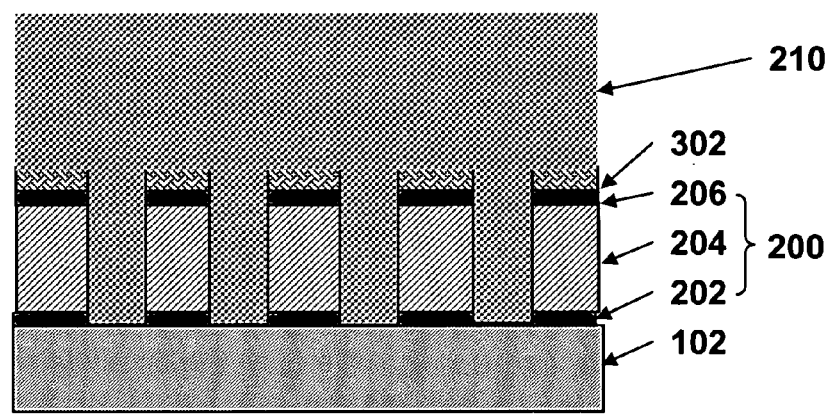

Next, turning to FIG. 1c, the gaps between the rails are filled with an insulating gap-filling material 210. The insulating layer 210 can be any electrically insulating material, such as silicon oxide, silicon nitride, or silicon oxynitride. The insulating layer 210 may be deposited in one step and then planarized by CMP for a desired amount of time to obtain a planar surface. Alternatively, the insulating layer 210 may be deposited as two separate sublayers, where a first sublayer is formed between the patterned 200 and 302 layers and a second sublayer is deposited over the first sublayer and over the patterned 200 and 302 layers. A first CMP step may be used to planarize the first sublayer using the first conductivity type polysilicon layer 302 as polish stop before the deposition of the second sublayer. A second CMP step may be used to planarize the second sublayer for a desired amount of time to obtain a planar surface. As shown in FIG. 1c, the planarized layer 210 extends over the patterned 200 and 302 layers.

Figure 1D:
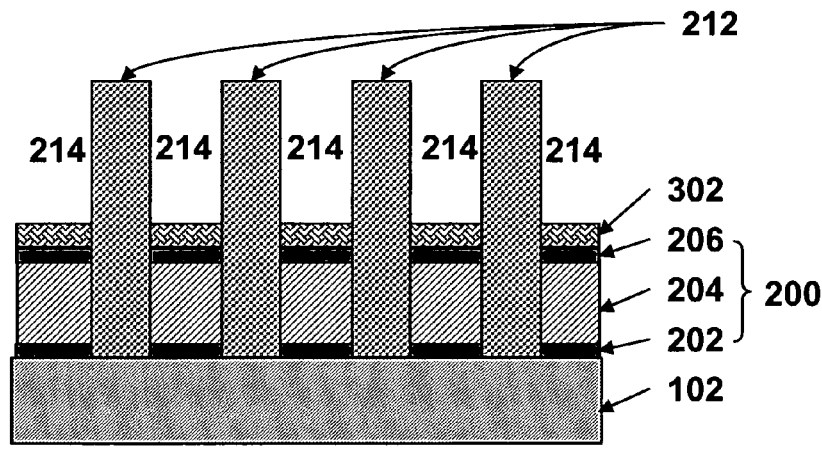

The insulating layer 210 can then be photolithographically patterned to form openings 214 exposing the first conductivity type polysilicon layer 302 in the patterned insulating layer, which is relabeled as 212, as shown in FIG. 1d. The openings 214 should have about the same pitch and about the same width as the patterned first conductivity type polysilicon layer 302. Some misalignment can be tolerated.

Figure 1E:
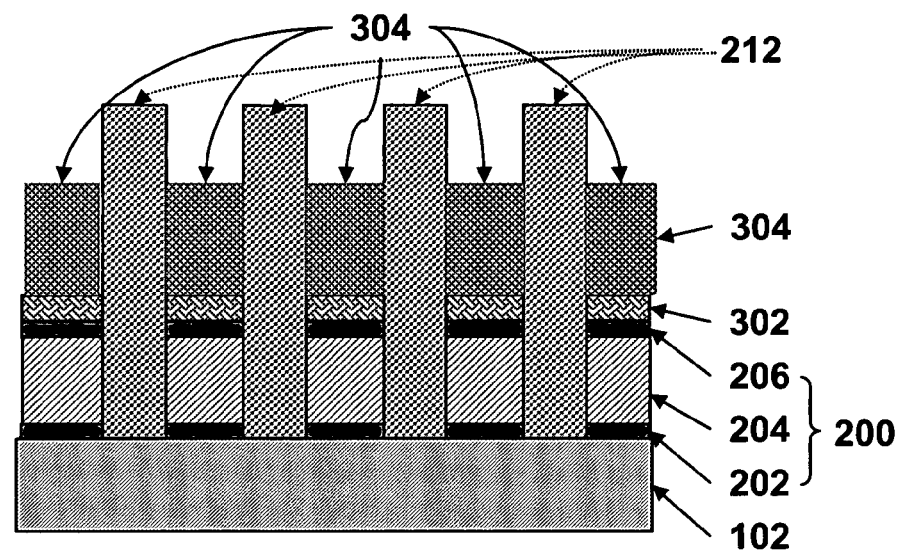
Figure 1F:
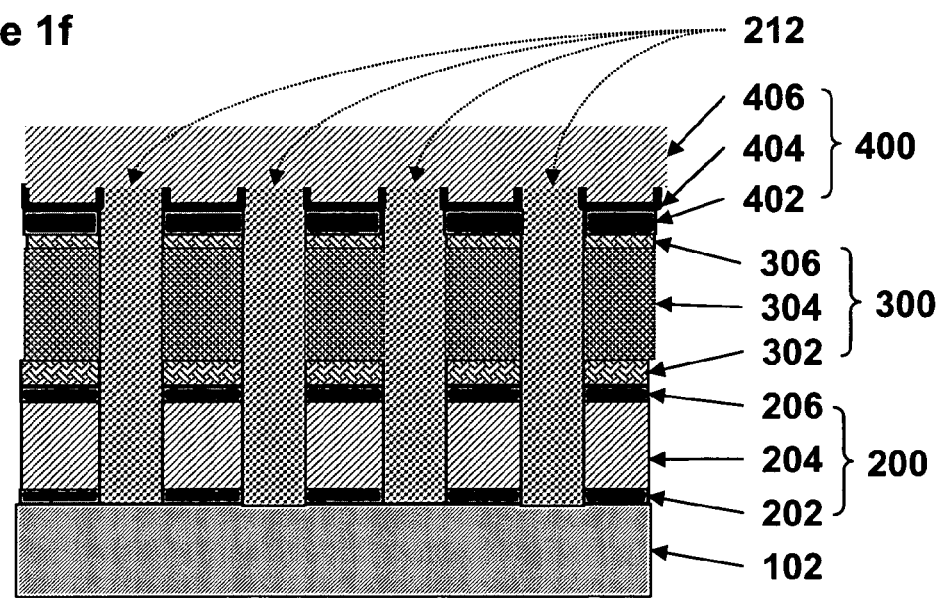
Figure 1G:
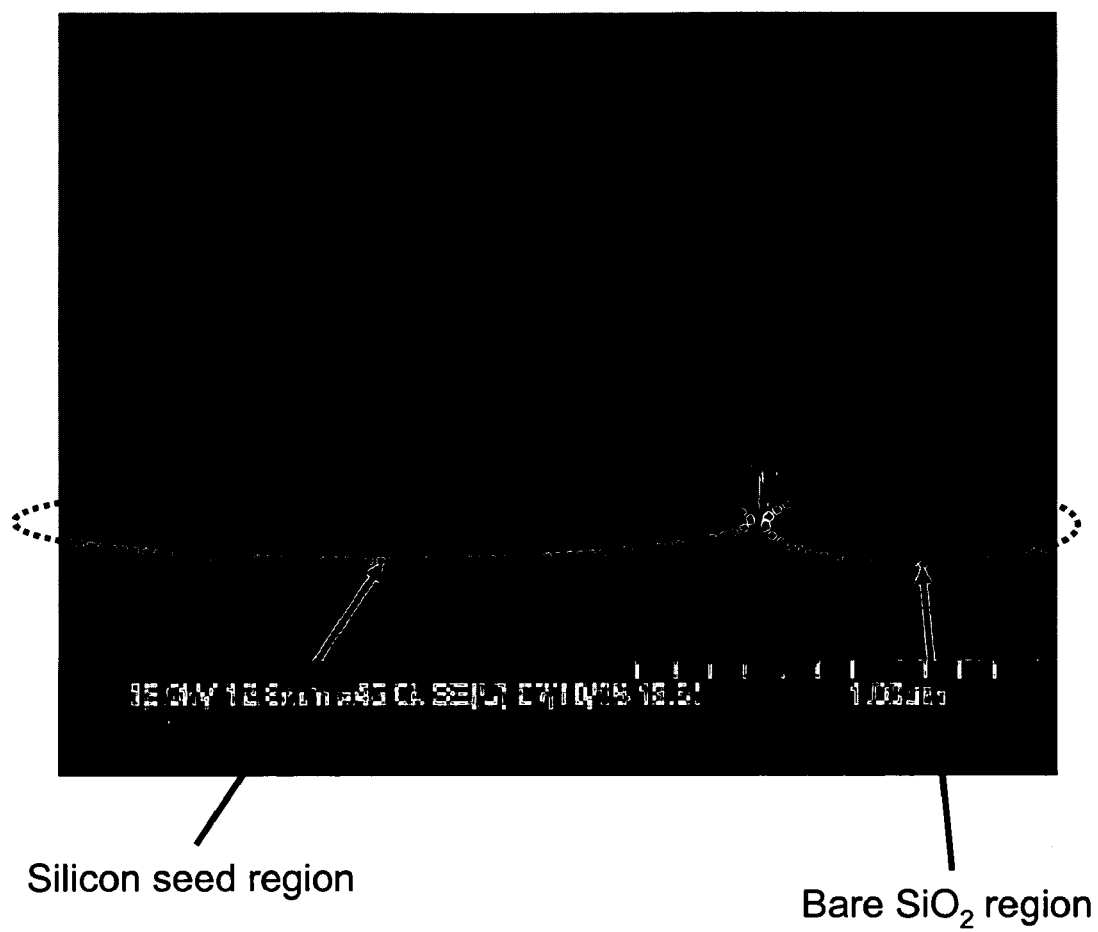
FIG. 1g is a SEM image of a polysilicon film selectively deposited on a silicon seed film. No polysilicon deposition on $SiO_2$ region was observed.

Referring to FIG. 1e, vertical intrinsic polysilicon pillars 304 can be selectively formed by low pressure chemical vapor deposition (LPCVD) selectively on the first conductivity type polysilicon layer 302 exposed in the openings 214, such that the intrinsic polysilicon partially fills the opening 214. Immediately prior to this step, an optional HF clean step can be conducted to clean the top surface of the first conductivity type polysilicon layer 302 exposed in the insulating layer 212, to improve the quality of the selective growth of the intrinsic polysilicon pillars 304. Any suitable method can be used to selectively deposit this intrinsic polysilicon pillars 304, and other suitable semiconductor materials can be used instead as well. For example, the method described in U.S. application Ser. No. 12/216,924 filed on Jul. 11, 2008, incorporated herein by reference, may be used to deposit the polysilicon pillars. FIG. 1g is a cross sectional SEM image, showing that a polysilicon layer is selectively grown over a silicon seed layer, while no polysilicon is deposited over the region of silicon oxide surface. Alternatively, the methods described in U.S. application Ser. No. 11/159,031 filed on Jun. 22, 2005 (which published as US Published Application 2006/0292301 A1) and in U.S. application Ser. No. 12/007,780 filed on Jan. 15, 2008, incorporated herein by reference, may be used to deposit the germanium pillars.

Alternatively, the intrinsic layer 304 can be formed in the openings by depositing intrinsic polysilicon into the openings 214 and over the insulating layer 212, planarizing the deposited intrinsic polysilicon, and etching an upper portion of the intrinsic polysilicon deposited to recess the intrinsic polysilicon 304 below the surface of the insulating layer 212. Thus, polysilicon 304 may be recessed in openings 214 irrespective of its fabrication method.

The second conductivity type polysilicon layer 306 can be formed during a separate CVD step or by turning on a flow of the dopant gas, such as phosphine or boron trichloride (to form n-type or p-type polysilicon, respectively), during the same CVD step as the deposition of layer 304. An optional CMP process can then be conducted to remove any bridged polysilicon formed on top of the insulating layer 212, and to planarize the surface preparing for the following lithography step. Alternatively, the second conductivity type polysilicon layer 306 may be formed by ion implantation of second conductivity type dopant into the upper region of the intrinsic polysilicon pillars 304. The formation of the second conductivity type polysilicon layer 306 completes formation of pillar shaped diodes 300 as shown in FIG. 1f. Layer 306 is preferably recessed in the openings 214.

The pillar device, such as a diode device, may comprise a one-time programmable (OTP) or re-writable nonvolatile memory device. For example, each diode pillar 300 may act as a steering element of a memory cell, and a resistivity switching layer working as a storage element 404 (i.e., which stores the data) can be provided in series with the diode 300, as shown in FIG. 1f. The storage element can be one of antifuse, fuse, metal oxide memory, switchable complex metal oxide, carbon nanotube memory, graphene resistivity switchable material, carbon resistivity switchable material, phase change material memory, conductive bridge element, or switchable polymer memory. The antifuse dielectric layer can be one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof.

As shown in FIG. 1f, a storage element, such as a resistivity switching material 404, such as a thin silicon oxide antifuse dielectric layer may be deposited over the diode pillar 300 followed by the deposition of the upper electrode 406 on the antifuse dielectric layer. Alternatively, the storage element 404 may be located below the diode pillar 300, such as between the conductive film 200 and the first conductivity type polysilicon layer 302.

In some embodiments, an optional third barrier layer 402 is located between the second conductivity type polysilicon layer 306 and the resistivity switching material, such as the antifuse dielectric layer 404. The third barrier layer 402 can be formed by high-pressure ionized physical vapor deposition and etching an upper portion of the third barrier layer to remove the barrier layer from a side wall of the opening 214. The third barrier layer 402 may comprise the same material as the first and second barrier layers, such as titanium nitride.

Figure 2A:
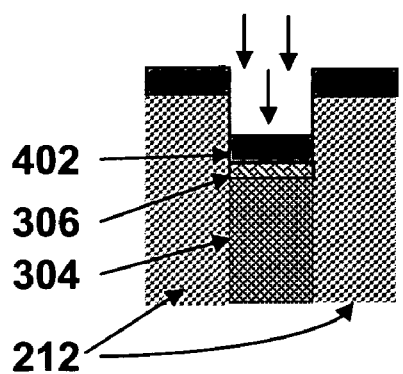
FIGS. 2a to 2c are side cross-sectional views illustrating stages in formation of a U-shaped storage element over a diode.
Figure 2B:
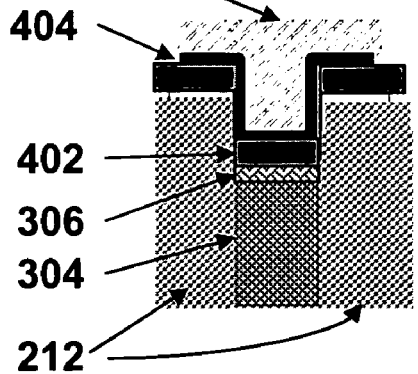
Figure 2C:
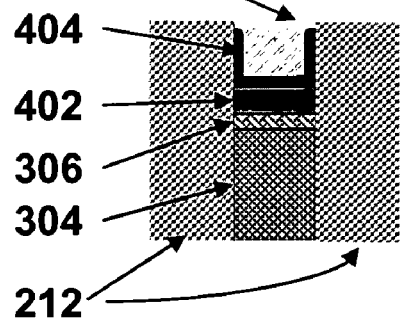

In some embodiments, as illustrated in FIG. 2a, the antifuse dielectric layer 404 can be deposited over the optional third barrier layer 402 or over the second conductivity type polysilicon layer 306 in case the optional third barrier layer 402 is absent. Any suitable deposition method may be used, for example, high pressure ionized PVD (physical vapor deposition) may be used in some embodiments. After further depositing a top conductive layer 406A over the antifuse dielectric layer 404 resulting in a structure shown in FIG. 2b, a CMP can be conducted to planarize the surface to expose the top of the insulating layer 212. In these embodiments, the storage element 404 has a U-shape cross sectional shape and element 404 is located over the steering element 300 as shown in FIG. 2c. More specifically, the storage element 404 comprises an antifuse dielectric layer having an open cylinder shape comprising a planar bottom portion located over the steering element 300 and a collar shaped upper portion located over and in contact with the bottom portion. A top conductive layer can then be deposited on top and patterned to form the upper electrode 406, resulting in a structure illustrated in FIGS. 1f and 2c.

Figure 3A:
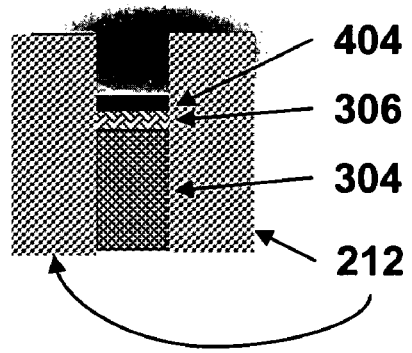
FIGS. 3a to 3b are side cross-sectional views illustrating stages in formation of a storage element over a diode using an alternative method.
Figure 3B:
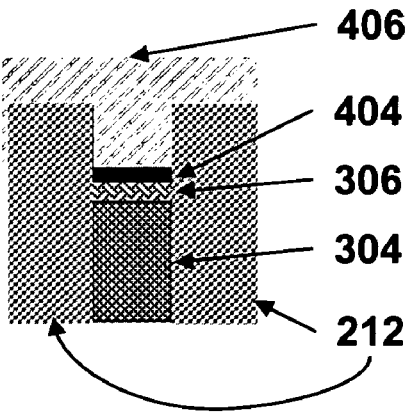

Alternatively, as illustrated in FIG. 3a, the antifuse dielectric layer 404 can be formed by plasma oxidizing an upper portion of a second conductivity type polysilicon layer 306. A top conductive layer can then be deposited over the antifuse dielectric layer 404 and patterned to form the upper electrode 406, resulting a structure demonstrated in FIG. 3b. The resulting structure of this alternative embodiment is similar to the structure illustrated in FIG. 1f, except the cross section of the antifuse dielectric layer 404 is not U-shaped.

In another embodiment of the invention, the stack of the first conductivity type semiconductor material layer 302 over the conductive rails 500, can be formed by an alternative method shown in FIGS. 4a through 4f. In some embodiments, the conductive rails comprise a copper layer.

Figure 4A:
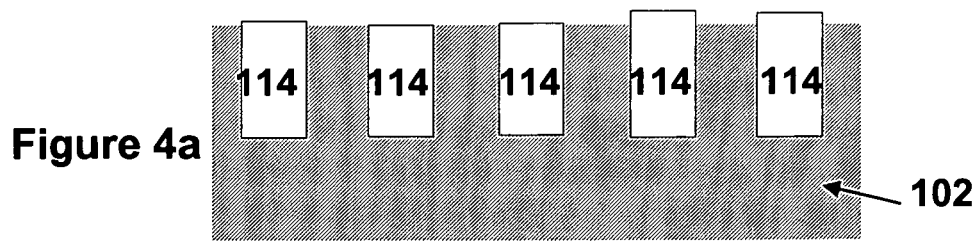
FIGS. 4a to 4f are side cross-sectional views illustrating stages in formation of a stack of the first conductivity type semiconductor material layer over the conductive rails using an alternative method.

Turning to FIG. 4a, an insulating layer 102, referred as insulating gap-filling material in some embodiments, can be patterned to form rail-shaped recesses 114. A copper seed layer (not shown) can be deposited in recesses 114 in the insulating gap-filling material, and a copper layer 504 can then be plated onto the copper seed layer. A CMP step is conducted to polish the surface to expose the top of the insulating layer 102, resulting in a structure showing in FIG. 4b. For the simplicity, a copper layer is used as a non-limiting example, but one of the ordinary skill of art would understand that any suitable conductive material, for example, tungsten, aluminum, copper, or alloys thereof, can also be used for the conductive layer 504. Any suitable method of depositing the conductive material can be used, for example, electroless plating and/or electroplating from a metal-organic bath may be used to deposit the copper layer 504.

Figure 4B:
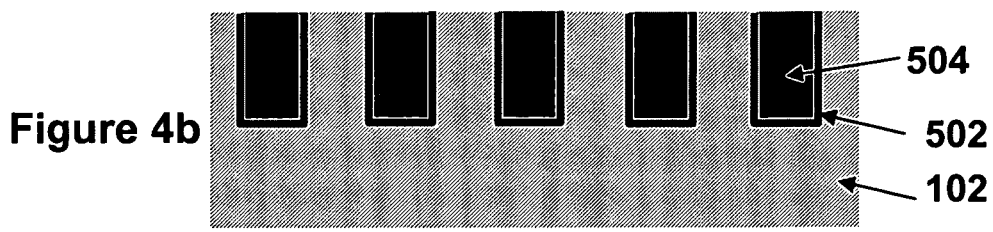
Figure 4C:
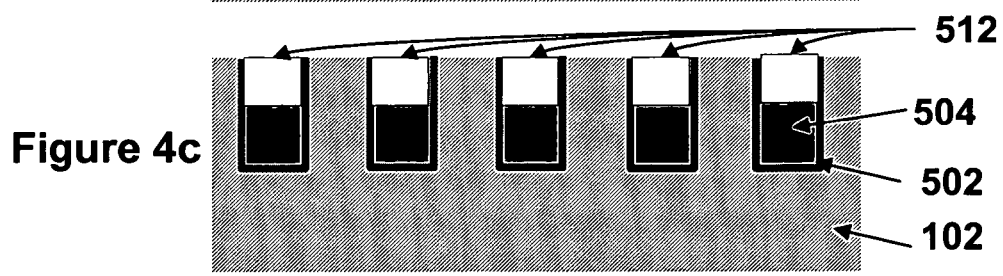
Figure 4D:
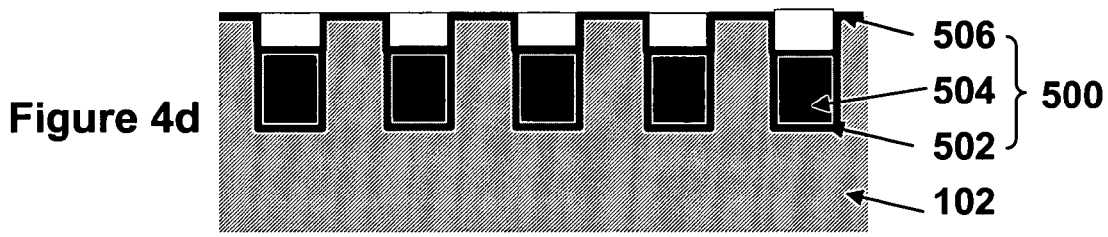

An upper portion of the copper layer 504 can be etched to recess the conductive rails below an upper surface of the insulating gap-filling material 102, as illustrated in FIG. 4c. Optionally, as shown in FIG. 4b-4d, the conductive rails 500 further comprise a first barrier layer 502 formed underneath the copper layer 504 before the deposition of the copper seed layer, and a second barrier layer 506 formed over the copper layer 504 after the step of etching the copper layer 504 to form the recess 512. The first barrier layer 502 and the second barrier layer 506 can be independently selected from a group consisting of titanium nitride, tantalum, tantalum nitride, ruthenium, titanium tungsten, tungsten nitride, or a combination thereof.

Figure 4E:
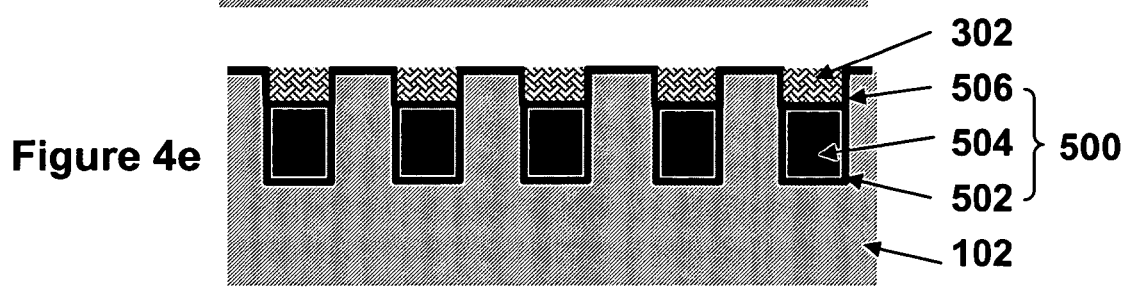

Next, turning to FIG. 4e, a first conductivity type semiconductor material layer 302 can be formed over the conductive rails 500 and over the insulating gap-filling material 102, followed by planarizing the first conductivity type semiconductor material layer 302 to expose the insulating gap-filling material 102 such that the first conductivity type semiconductor material 302 remains in recesses above the conductive rails 500.

Figure 4F:
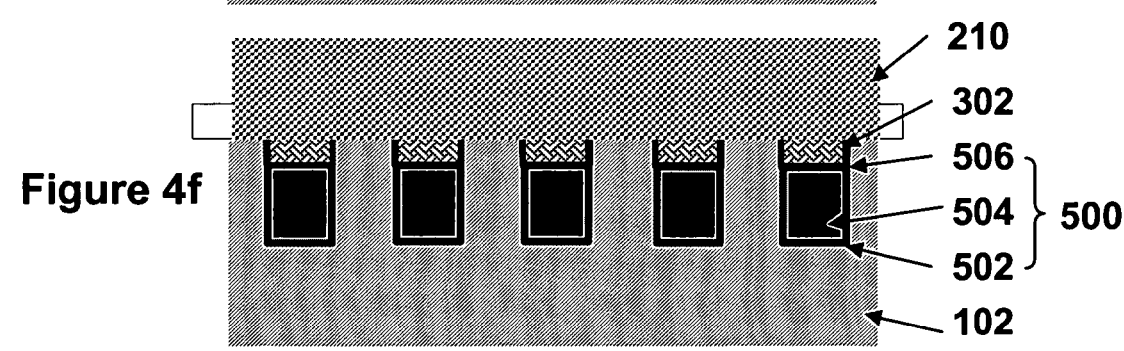

An insulating layer 210 can then be formed over the first conductivity type semiconductor material, resulting in a structure illustrated in FIG. 4f, similar to the structure shown in FIG. 1c. This embodiment can further comprise forming openings in the insulating layer exposing the first conductivity type semiconductor material, forming an intrinsic semiconductor material in the openings, and forming a second conductivity type semiconductor material in the openings to form a p-i-n diode, using methods described above with respect to FIGS. 1d through 1f.

Formation of a first memory level has been described above. Additional memory levels can be formed above this first memory level to form a monolithic three dimensional memory array. In some embodiments, conductors can be shared between memory levels; i.e. top electrodes 406 would serve as the lower electrodes of the next memory level. In other embodiments, an interlevel dielectric can be formed above the first memory level, its surface planarized, and construction of a second memory level begins on this planarized interlevel dielectric, with no shared electrodes.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays. In contrast to the process described in Leedy, in an embodiment of the present invention, diodes share a conducting wire or electrode between two adjacent layers. In this configuration, the "bottom" diode will "point" in the opposite direction of the diode in the "upper" layer (i.e., the same conductivity type layer of each diode electrically contacts the same wire or electrode located between the diodes). With this configuration, the two diodes can share the wire between them and still not have a read or write disturb issue.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a semiconductor device, comprising:
   forming a first conductivity type polysilicon layer over a substrate;
   forming an insulating layer over the first conductivity type polysilicon layer, wherein the insulating layer comprises an opening exposing the first conductivity type polysilicon layer; and
   forming an intrinsic polysilicon layer in the opening;
   wherein the step of forming the intrinsic polysilicon layer in the opening comprises depositing intrinsic polvsilicon into the opening and over the upper surface of the insulating layer, planarizing the deposited intrinsic polysilicon, and etching an upper portion of the intrinsic polysilicon deposited in the opening to recess the intrinsic polysilicon later below the surface of the insulating layer.

2. The method of claim 1, wherein the step of forming the intrinsic polysilicon layer in the opening comprises selectively growing polysilicon on the first conductivity type polysilicon layer such that the intrinsic polysilicon layer partially fills the opening.

3. The method of claim 1, further comprising:
   forming a conductive layer over the substrate prior to the step of forming the first conductivity type polysilicon layer;
   patterning the conductive film and the first conductivity type polysilicon layer to form rails that comprise lower electrodes covered by the first conductivity type polysilicon layer; and
   filling gaps between the rails with an insulating gap-filling material prior to the step of forming the insulating layer.

4. The method of claim 3, wherein:
   the conductive film comprises a first barrier layer, a conductive wiring material located over the first barrier layer, and a second barrier layer located over the conductive wiring material;
   the conductive wiring material comprises at least one selected from a group consisting of tungsten, aluminum, copper, or alloys thereof; and the first and second barrier layers are independently selected from a group consisting of titanium nitride, tantalum, tantalum nitride, ruthenium, titanium tungsten, or tungsten nitride.

5. The method of claim 1, wherein the semiconductor device comprises a p-i-n diode having a pillar shape.

6. The method of claim 5, further comprising implanting second conductivity type dopants into an upper portion of the intrinsic polysilicon layer to form a second conductivity type region of the p-i-n diode.

7. The method of claim 5, further comprising selectively depositing a second conductivity type polysilicon layer in the opening on the intrinsic polysilicon layer to form a second conductivity type region of the p-i-n diode.

8. The method of claim 5, further comprising forming a storage element of a nonvolatile memory cell over the p-i-n diode.

9. A method of making a semiconductor device wherein the semiconductor device comprises a p-i-n diode having a pillar shape, comprising:
   forming a first conductivity type polysilicon layer over a substrate
   forming an insulating layer over the first conductivity type polysilicon layer, wherein the insulating layer comprises an opening exposing the first conductivity type polysilicon layer;
   forming an intrinsic polysilicon layer in the opening; and
   forming a storage element of a nonvolatile memory cell over the p-i-n diode, wherein:
   the storage element comprises an antifuse dielectric layer, and
   the step of forming the storage element comprises a step of plasma oxidation of an upper portion of a second conductivity type polysilicon material of the diode.

10. The method of claim 8, wherein forming the storage element comprises:
   forming a third barrier layer by high-pressure ionized physical vapor deposition;
   etching an upper portion of the third barrier layer to remove the barrier layer from a side wall of the opening; and
   forming the storage element in the opening over the third barrier layer.

11. The method of claim 8, further comprising forming an upper electrode over the storage element.

12. A method of making a semiconductor device, comprising:
   providing conductive rails and an insulating gap-filling material located between the rails;
   etching an upper portion of the conductive rails to recess the conductive rails below an upper surface of the insulating gap-filling material;
   forming a first conductivity type semiconductor material layer over the conductive rails and over the insulating gap-filling material;
   planarizing the first conductivity type semiconductor material layer to expose the insulating gap-filling material such that the first conductivity type semiconductor material remains in recesses above the conductive rails;
   forming an insulating layer over the first conductivity type semiconductor material;
   forming openings in the insulating layer exposing the first conductivity type semiconductor material;
   forming an intrinsic semiconductor material in the openings; and
   forming a second conductivity type semiconductor material in the openings to form a p-i-n diode;
   wherein the conductive rails comprise a copper layer; and
   wherein the copper layer is formed by:
      depositing a copper seed layer in recesses in the insulating gap-filling material; and
      plating the copper layer on the copper seed layer.

13. The method of claim 12 wherein:
   the conductive rails further comprise a first barrier layer located underneath the copper layer and a second barrier layer located over the copper layer; and
   the first and second barrier layers are independently selected from a group consisting of titanium nitride, tantalum, tantalum nitride, ruthenium, titanium tungsten, or tungsten nitride.

14. The method of claim 12, wherein the intrinsic semiconductor material comprises polysilicon, and wherein the step of forming the intrinsic semiconductor material in the openings comprises selectively growing intrinsic polysilicon on the first conductivity type semiconductor material such that the intrinsic polysilicon partially fills the opening.

15. The method of claim 12, wherein the intrinsic semiconductor material comprises polysilicon, and wherein the step of forming the intrinsic semiconductor material in the openings comprises depositing intrinsic polysilicon into the openings and over the insulating layer, planarizing the deposited intrinsic polysilicon, and etching an upper portion of the intrinsic polysilicon deposited in the openings to recess the intrinsic polysilicon below the surface of the insulating layer.

16. The method of claim 12, wherein the semiconductor device comprises a pillar device.

17. The method of claim 12, further comprising forming a storage element of a nonvolatile memory cell over the p-i-n diode.

18. The method of claim 17, wherein the storage element is one of antifuse, fuse, metal oxide memory, switchable complex metal oxide, carbon nanotube memory, graphene resistivity switchable material, carbon resistivity switchable material, phase change material memory, conductive bridge element, or switchable polymer memory.

19. The method of claim 17, wherein:
   the storage element comprises an antifuse dielectric layer, and
   the step of forming a storage element comprises a step of plasma oxidation of an upper portion of the second conductivity type semiconductor material.

20. A method of making a semiconductor device, comprising:
   providing conductive rails and an insulating gap-filling material located between the rails;
   etching an upper portion of the conductive rails to recess the conductive rails below an upper surface of the insulating gap-filling material;
   forming a first conductivity type semiconductor material layer over the conductive rails and over the insulating gap-filling material;
   planarizing the first conductivity type semiconductor material layer to expose the insulating gap-filling material such that the first conductivity type semiconductor material remains in recesses above the conductive rails;
   forming an insulating layer over the first conductivity type semiconductor material;
   forming openings in the insulating layer exposing the first conductivity type semiconductor material;
   forming an intrinsic semiconductor material in the openings;
   forming a second conductivity type semiconductor material in the openings to form a p-i-n diode; and
   forming a storage element of a nonvolatile memory cell over the p-i-n diode; wherein:

the storage element comprises an antifuse dielectric layer, and the step of forming a storage element comprises a step of plasma oxidation of an upper portion of the second conductivity type semiconductor material.

21. A method of making a semiconductor device, comprising:

forming a first conductivity type polysilicon layer over a substrate;

forming an insulating layer over the first conductivity type polysilicon layer, wherein the insulating layer comprises an opening exposing the first conductivity type polysilicon layer; and forming an intrinsic polysilicon layer in the opening;

wherein the semiconductor device comprises a p-i-n diode having a pillar shape;

the method further comprising forming a storage element of a nonvolatile memory cell over the p-i-n diode, wherein forming the storage element comprises:

forming a third barrier layer by high-pressure ionized physical vapor deposition;

etching an upper portion of the third barrier layer to remove the barrier layer from a side wall of the opening; and forming the storage element in the opening over the third barrier layer.

* * * * *